United States Patent
Yoshida

(10) Patent No.: US 11,843,239 B2
(45) Date of Patent: Dec. 12, 2023

(54) FIELD DEVICE

(71) Applicant: Yokogawa Electric Corporation, Musashino (JP)

(72) Inventor: Fumihiro Yoshida, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 255 days.

(21) Appl. No.: 17/503,507

(22) Filed: Oct. 18, 2021

(65) Prior Publication Data

US 2022/0131363 A1  Apr. 28, 2022

(30) Foreign Application Priority Data

Oct. 26, 2020 (JP) .................................. 2020-178884

(51) Int. Cl.
*H02H 9/00* (2006.01)
*H02H 3/38* (2006.01)
*H02H 1/00* (2006.01)
*H02H 7/20* (2006.01)

(52) U.S. Cl.
CPC ............ *H02H 3/38* (2013.01); *H02H 1/0061* (2013.01); *H02H 7/20* (2013.01)

(58) Field of Classification Search
CPC ........... H02H 3/38; H02H 1/0061; H02H 7/20
USPC ......................................................... 361/58
See application file for complete search history.

(56) References Cited

U.S. PATENT DOCUMENTS

| 2011/0037478 A1* | 2/2011 | Ohya ........................ G05B 9/02 324/500 |
| 2012/0249231 A1 | 10/2012 | Okuda et al. |
| 2019/0140576 A1* | 5/2019 | Hata ..................... H02P 29/024 |

FOREIGN PATENT DOCUMENTS

| JP | 09-081883 A | 3/1997 |
| JP | 2010-003043 A | 1/2010 |
| JP | 2012-208805 A | 10/2012 |

* cited by examiner

*Primary Examiner* — Jared Fureman
*Assistant Examiner* — Lucy M Thomas
(74) *Attorney, Agent, or Firm* — WHDA, LLP

(57) ABSTRACT

A field device includes: a current controller configured to operate with a first power supply voltage and output a control signal for controlling a current to be output to a transmission line; a current output unit configured to operate with a second power supply voltage different from the first power supply voltage, the current output unit being capable of outputting a current of a magnitude corresponding to the control signal output from the current controller to the transmission line; and an abnormality notification unit configured to output, to the current output unit, a first signal for causing the current output unit to output a burnout current indicating that an abnormality has occurred in a case in which an abnormality occurs in the first power supply voltage.

20 Claims, 7 Drawing Sheets

FIG. 3

| PERIOD | M1 | M2 | SL1 | SL2 | OUTPUT OF FIRST SELECTOR | OUTPUT OF SECOND SELECTOR | Iout |
|---|---|---|---|---|---|---|---|
| AT THE TIME OF STARTING(T1) | Low | Low | Low | Low | CLK | CLK | STARTING CURRENT (12mA) |
| AT THE TIME OF NORMALITY(T2) | High | High | High | High | P | PWM SIGNAL | 4~20mA |
| AT THE TIME OF ABNORMALITY OF V1(T3) | Low | High | High | Low | P | P | BURNOUT CURRENT |
| AT THE TIME OF ABNORMALITY OF V2(T4) | High | Low | High | High | P | PWM SIGNAL | BURNOUT CURRENT |

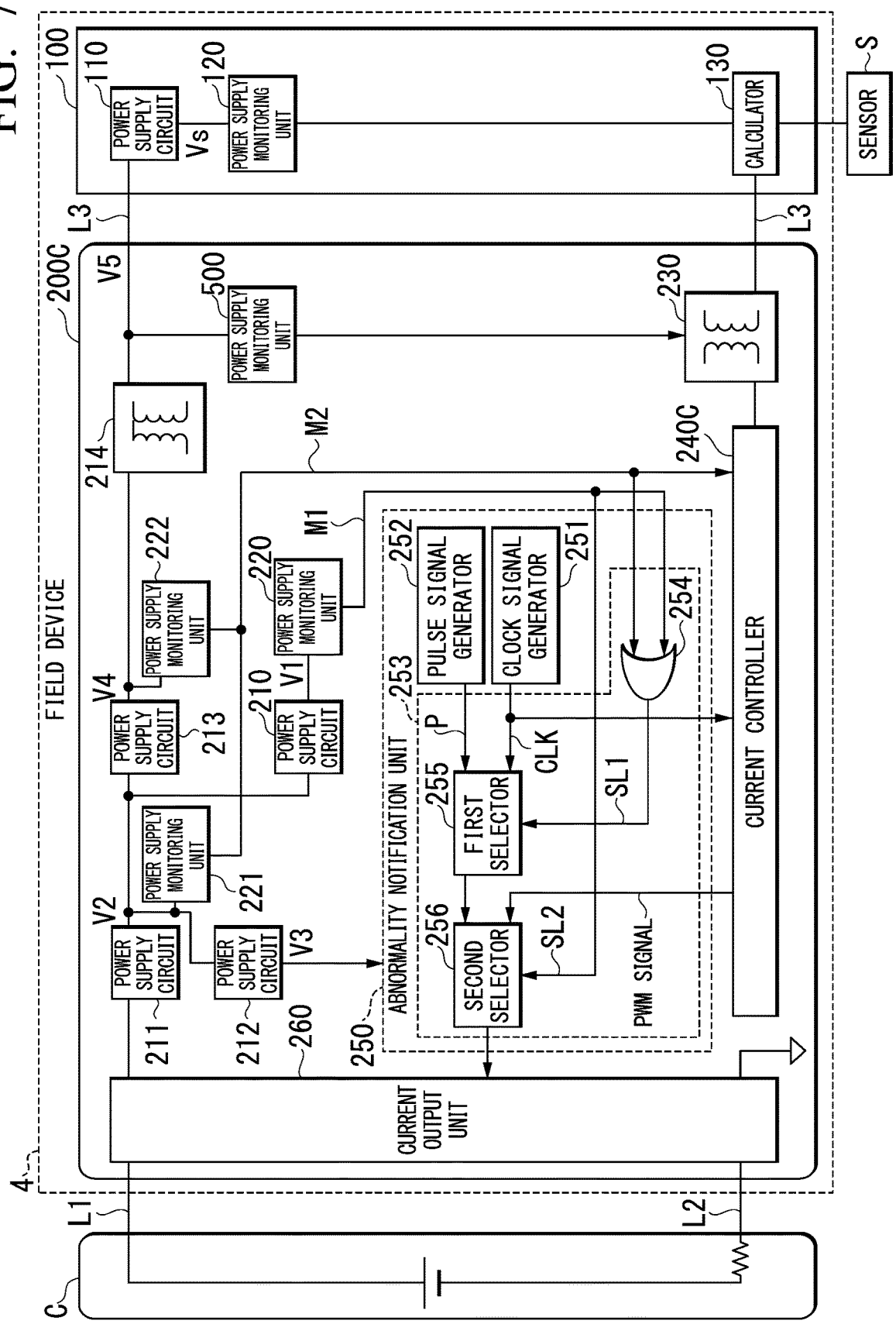

FIELD DEVICE

BACKGROUND

Field of the Invention

The present invention relates to a field device.

Priority is claimed on Japanese Patent Application No. 2020-178884, filed on Oct. 26, 2020, the contents of which are incorporated herein by reference.

Description of Related Art

In a plant, a factory, or the like, a distributed control system (DCS) is provided to realize a highly automatic operation. In this distributed control system, a field device (for example, a measuring device or an operating device) and a control device that controls the field device are connected to each other via a communication means. An example of the field device used in such a system is a two-wire transmission device that transmits an analog signal according to a measured process value (for example, pressure, a flow rate, a temperature, or the like) to the control device via a two-wire transmission line.

Japanese Unexamined Patent Application Publication No. H9-81883 discloses a two-wire transmission device of the related art. This two-wire transmission device includes a current controller (a digital circuit) that controls a current to be output to a transmission line, and a current output unit (an analog circuit) that outputs a current having a magnitude corresponding to a control signal output from the current controller to the transmission line. At normal times, the current output unit outputs a current in a range of, for example, 4 to 20 mA, and at the time of an abnormality (for example, at the time of an abnormality of a power supply), the current output unit outputs a current of, for example, 3.6 mA or less or 21.6 mA or more (burnout output).

Incidentally, the two-wire transmission device disclosed in Japanese Unexamined Patent Application Publication No. H9-81883 includes a first power supply circuit that generates a first power supply voltage for operating the current controller and a second power supply circuit that generates a second power supply voltage for operating the current output unit. Here, in a case in which the second power supply voltage decreases due to an abnormality of the second power supply circuit, the current controller outputs a control signal for executing the burnout output, and the current output unit executes the burnout output. As a result, a control device connected to the two-wire transmission device is notified that an abnormality has occurred in the field device.

However, in a case in which an abnormality occurs in the first power supply circuit, the first power supply voltage may exceed a voltage range in which the current controller is operable, and the current controller may not operate normally. In such a case, there is a problem that it is not possible to notify the control device connected to the two-wire transmission device that an abnormality has occurred in the field device.

SUMMARY

A field device may include: a current controller configured to operate with a first power supply voltage and output a control signal for controlling a current to be output to a transmission line; a current output unit configured to operate with a second power supply voltage different from the first power supply voltage, the current output unit being capable of outputting a current of a magnitude corresponding to the control signal output from the current controller to the transmission line; and an abnormality notification unit configured to output, to the current output unit, a first signal for causing the current output unit to output a burnout current indicating that an abnormality has occurred in a case in which an abnormality occurs in the first power supply voltage.

Further features and aspects of the present disclosure will become apparent from the following detailed description of exemplary embodiments with reference to the attached drawings.

BRIEF DESCRIPTION OF THE DRAWINGS

FIG. 3 is a diagram showing states of the various signals of the field device according to the first embodiment of the present invention.

FIG. 7 is a block diagram showing main constituent elements of a field device according to a fourth embodiment of the present invention.

DETAILED DESCRIPTION OF THE INVENTION

Figure 1:
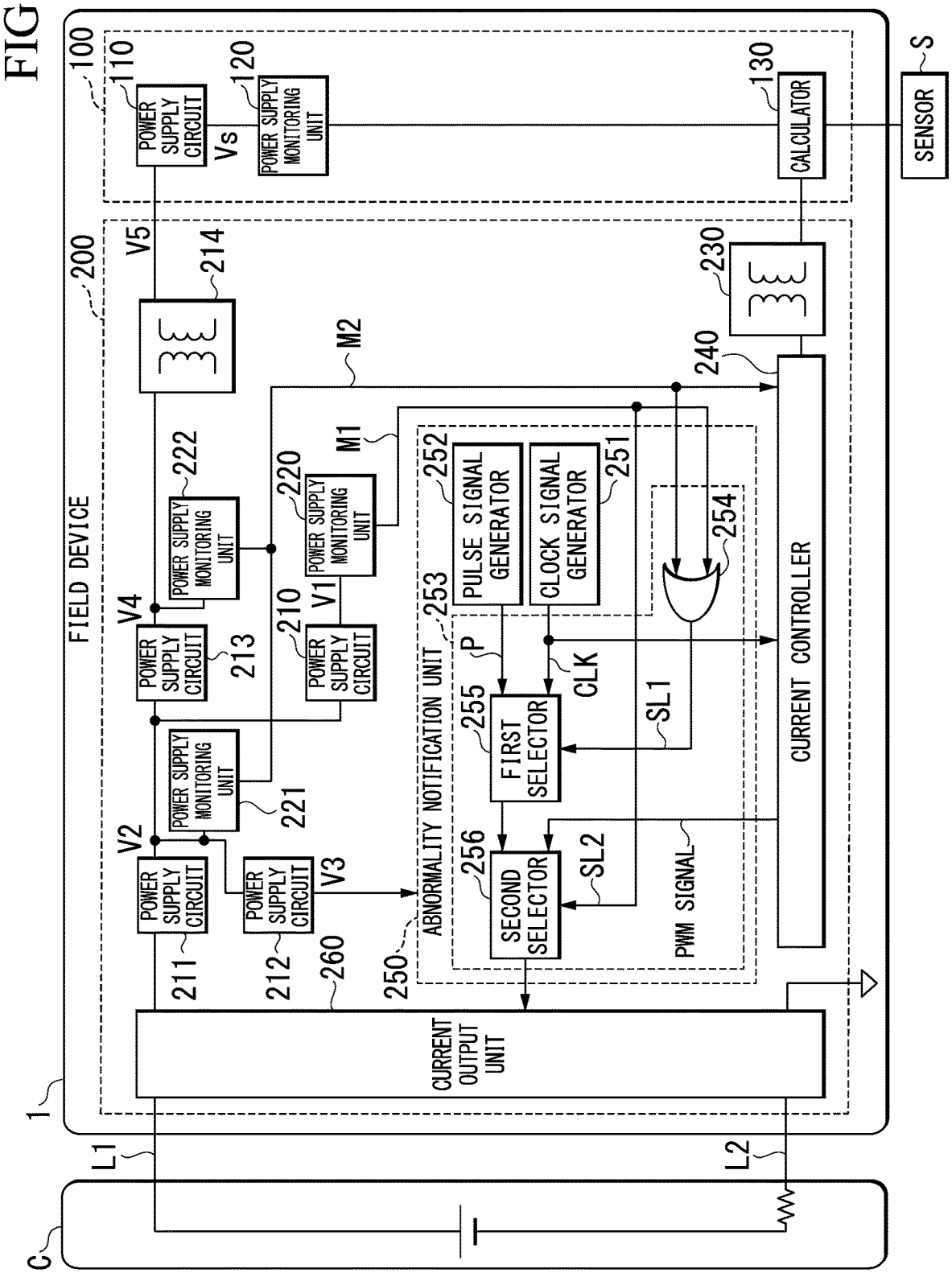
FIG. 1 is a block diagram showing main constituent elements of a field device according to a first embodiment of the present invention.

The embodiments of the present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

An aspect of the present invention is to provide a field device in which it is possible to notify an external device that an abnormality has occurred even in a case in which an abnormality occurs in a power supply voltage which is supplied to a current controller that controls a current to be output to a transmission line.

Hereinafter, a field device according to the embodiments of the present invention will be described in detail with reference to the drawings. Hereinafter, an outline of the embodiments of the present invention will be described first, and then details of each embodiment of the present invention will be described.

[Outline]

As a two-wire transmission device which is a type of field device, there is one that includes a current controller that outputs a control signal for controlling a current to be output to a transmission line, and a current output unit that outputs a current having a magnitude corresponding to the control signal output from the current controller to the transmission line. In such a two-wire transmission device, a PWM signal having a pulse width corresponding to a sensor value indicating a measurement result of a sensor is output as a control signal from the current controller, and a current corresponding to the pulse width of the PWM signal (for example, a current in a range of 4 to 20 mA) is output from the current output unit to the transmission line.

Further, in a case in which an abnormality such as a power supply abnormality occurs, such a two-wire transmission device can output a current (for example, a current of 3.6 mA or less or a current of 21.6 mA or more) indicating that an abnormality has occurred (burnout output). In a case in which the burnout output is performed, the current controller outputs a signal having a pulse width different from the pulse width that can be obtained according to the above-described sensor value to the current output unit.

Here, the current controller is a digital circuit and operates at a first power supply voltage. On the other hand, the current output unit is an analog circuit and operates at a second power supply voltage different from the first power supply voltage. In a case in which the second power supply voltage decreases, the current controller outputs a control signal for executing the burnout output, and the current output unit executes the burnout output. As a result, a control device connected to the two-wire transmission device is notified that an abnormality has occurred in the field device. However, in a case in which the first power supply voltage decreases, the current controller may not operate normally. In such a case, it is not possible to notify the control device connected to the two-wire transmission device that an abnormality has occurred in the field device.

Further, in the two-wire transmission device of the related art, only a decrease in the first power supply voltage and the second power supply voltage is detected, and an increase in the first power supply voltage and the second power supply voltage is not detected. Therefore, in a case in which the first power supply voltage increases above a specified value or in a case in which the second power supply voltage increases above a specified value, it is not detected as an abnormality, and thus the control device connected to the two-wire transmission device is not notified that an abnormality has occurred.

In addition, in the two-wire transmission device of the related art, since a large amount of current is necessary at the time of starting, control is performed to output a starting current, which is a current necessary for starting, to the current output unit. For example, control is performed such that a current (12 mA) that is 50% of a current in a range of 4 to 20 mA is output to the current output unit as the starting current. Since such control is necessary to reliably start the two-wire transmission device, it is necessary to maintain the control even in a case in which the two-wire transmission device is improved.

An embodiment of the present invention includes: a current controller that operates with a first power supply voltage and outputs a control signal for controlling a current to be output to a transmission line; a current output unit that operates with a second power supply voltage different from the first power supply voltage and is capable of outputting a current of a magnitude corresponding to the control signal output from the current controller to the transmission line; and an abnormality notification unit that outputs a first signal for causing the current output unit to output a burnout current indicating that an abnormality has occurred to the current output unit in a case in which an abnormality occurs in the first power supply voltage. As a result, it is possible to notify an external device that an abnormality has occurred even in a case in which an abnormality occurs in a power supply voltage which is supplied to a current controller that controls a current to be output to a transmission line.

First Embodiment

<Field Device>

FIG. 1 is a block diagram showing main constituent elements of a field device according to a first embodiment of the present invention. As shown in FIG. 1, a field device 1 of the present embodiment includes a sensor module 100 and a transmitter 200 and is connected to an external device C via two transmission lines L1 and L2. The external device C is, for example, a control device that forms the core of a distributed control system. Such a field device 1 operates with a current supplied from the external device C via the two transmission lines L1 and L2 and outputs a sensor value indicating a measurement result of a sensor S by controlling the current flowing through the two transmission lines L1 and L2 to the external device C.

The sensor module 100 includes a power supply circuit 110, a power supply monitoring unit 120, and a calculator 130 and obtains a sensor value indicating a measurement result of the sensor S. The power supply circuit 110 generates a power supply voltage Vs which is an operating power supply of the sensor module 100 from electric power which is supplied from the transmitter 200. The power supply voltage Vs is supplied to each unit such as the power supply monitoring unit 120 and the calculator 130 that constitute the sensor module 100. The power supply monitoring unit 120 monitors the power supply voltage Vs generated by the power supply circuit 110. The calculator 130 acquires a measurement result of the sensor S (for example, a measurement result of a temperature, pressure, a flow rate, or the like) and performs analog/digital conversion (A/D conversion) on the acquired measurement result to obtain a sensor value.

The transmitter 200 includes power supply circuits 210 to 214, power supply monitoring units 220 to 222, a communication unit 230, a current controller 240, an abnormality notification unit 250, and a current output unit 260. Such a transmitter 200 outputs the sensor value to the external device C by controlling the current flowing through the two transmission lines L1 and L2 according to the sensor value obtained by the sensor module 100. Further, in a case in which an abnormality occurs in the power supply circuit (for example, the power supply circuits 210 and 211), the transmitter 200 outputs a notification of that state to the external device C.

In a case in which the sensor value is output to the external device C, the transmitter 200 performs control such that, for example, the current flowing through the two transmission lines L1 and L2 is in a range of 4 to 20 mA. Further, in a case in which a notification of the state in which an abnormality occurs in the power supply circuit is output to the external device C, the transmitter 200 outputs, for example, a current of 3.6 mA or less or a current of 21.6 mA or more (burnout current).

The power supply circuit 210 generates a power supply voltage V1 (a first power supply voltage) which is an operating voltage of the current controller 240. Specifically, the power supply circuit 210 generates the power supply voltage V1 by stepping down a power supply voltage V2 (a second power supply voltage) which is a power supply voltage generated by the power supply circuit 211. For example, assuming that the power supply voltage V2 is 5.5 V, the power supply circuit 210 generates a power supply voltage V1 of 3.0 V. The power supply circuit 211 generates the power supply voltage V2 which is an operating voltage of the current output unit 260 from electric power which is supplied from the external device C via the transmission lines L1 and L2.

The power supply circuit 212 generates a power supply voltage V3 which is an operating voltage of the abnormality notification unit 250. Specifically, the power supply circuit 212 generates the power supply voltage V3 by stepping down the power supply voltage V2 generated by the power supply circuit 211. For example, the power supply circuit 212 generates a power supply voltage V3 of 2.5 V. The power supply circuit 213 generates a power supply voltage V4 which is an operating voltage of a display or the like (not shown) provided in the field device 1. Specifically, the power supply circuit 213 generates the power supply voltage V4 by stepping down the power supply voltage V2 generated by the power supply circuit 211. For example, the power supply circuit 213 generates a power supply voltage V4 of 5.0 V.

The power supply circuit 214 generates a power supply voltage V5 (a third power supply voltage) which is an operating voltage of the sensor module 100. The power supply circuit 214 generates the power supply voltage V5 by stepping down the power supply voltage V4 generated by the power supply circuit 213. For example, the power supply circuit 214 generates a power supply voltage V5 of 3.2 V. The power supply circuit 214 has, for example, an insulated transformer, and the primary side of the insulated transformer is connected to the power supply circuit 213 and the secondary side of the insulated transformer is connected to the power supply circuit 110 of the sensor module 100. Therefore, the power supply voltage V5 is supplied from the power supply circuit 214 to the power supply circuit 110, and thus the power supply voltage Vs is generated.

The power supply monitoring unit 220 (a first power supply monitoring unit) monitors the power supply voltage V1 and outputs a signal M1 indicating the presence or absence of an abnormality of the power supply voltage V1 to the abnormality notification unit 250. In a case in which the power supply voltage V1 is out of a first voltage range, the power supply monitoring unit 220 outputs a signal (a first abnormality signal) indicating an abnormality of the power supply voltage V1 to the abnormality notification unit 250. An abnormality of the power supply voltage V1 occurs when the power supply voltage V1 is an over-voltage or an under-voltage. It is assumed that the signal indicating an abnormality of the above power supply voltage V1 is a Low level signal.

Here, the above first voltage range is a range between an upper limit threshold value Vth11 and a lower limit threshold value Vth12. In a case in which the power supply voltage V1 exceeds the upper limit threshold value Vth11, the power supply monitoring unit 220 outputs a Low level signal M1 assuming that the power supply voltage V1 is an over-voltage. Further, in a case in which the power supply voltage V1 is less than the lower limit threshold value Vth12, the power supply monitoring unit 220 outputs a Low level signal M1 assuming that the power supply voltage V1 is an under-voltage. On the other hand, in a case in which the power supply voltage V1 is in the first voltage range, the power supply monitoring unit 220 outputs a High level signal M1 indicating that the power supply voltage V1 is normal assuming that no abnormality has occurred in the power supply voltage V1.

The power supply monitoring unit 221 (a second power supply monitoring unit) monitors the power supply voltage V2 and outputs a signal M2 indicating the presence or absence of an abnormality of the power supply voltage V2 to the current controller 240 and the abnormality notification unit 250. In a case in which the power supply voltage V2 is out of the second voltage range, the power supply monitoring unit 221 outputs a signal (a second abnormality signal) indicating an abnormality of the power supply voltage V2 to the current controller 240 and the abnormality notification unit 250. An abnormality of the power supply voltage V2 occurs when the power supply voltage V2 is an over-voltage or an under-voltage. It is assumed that the signal indicating an abnormality of the above power supply voltage V2 is a Low level signal.

Here, the above second voltage range is a range between an upper limit threshold value Vth21 and a lower limit threshold value Vth22. In a case in which the power supply voltage V2 exceeds the upper limit threshold value Vth21, the power supply monitoring unit 221 outputs a Low level signal M2 assuming that the power supply voltage V2 is an over-voltage. Further, in a case in which the power supply voltage V2 is less than the lower limit threshold value Vth22, the power supply monitoring unit 221 outputs a Low level signal M2 assuming that the power supply voltage V2 is an under-voltage. On the other hand, in a case in which the power supply voltage V2 is in the second voltage range, the power supply monitoring unit 221 outputs a High level signal M2 indicating that the power supply voltage V2 is normal assuming that no abnormality has occurred in the power supply voltage V2.

The power supply monitoring unit 222 monitors the power supply voltage V4 and outputs a signal indicating the presence or absence of an abnormality of the power supply voltage V4 to the current controller 240 and the abnormality notification unit 250. In a case in which the power supply voltage V4 is out of a third voltage range, the power supply monitoring unit 222 outputs a signal indicating an abnormality of the power supply voltage V4 to the current controller 240 and the abnormality notification unit 250. An abnormality of the power supply voltage V4 occurs when the power supply voltage V4 is an over-voltage or an under-voltage. It is assumed that the signal indicating an abnormality of the above power supply voltage V4 is a Low level signal.

Here, the third voltage range is a range between an upper limit threshold value Vth31 and a lower limit threshold value Vth32. In a case in which the power supply voltage V4 exceeds the upper limit threshold value Vth31, the power supply monitoring unit 222 outputs a Low level signal assuming that the power supply voltage V4 is an over-voltage. Further, in a case in which the power supply voltage V4 is less than the lower limit threshold value Vth32, the power supply monitoring unit 222 outputs a Low level signal assuming that the power supply voltage V4 is an under-voltage. On the other hand, in a case in which the power supply voltage V4 is in the third voltage range, the power supply monitoring unit 222 outputs a High level signal indicating that the power supply voltage V4 is normal assuming that no abnormality has occurred in the power supply voltage V4. Each of the above-described power supply monitoring units 220 to 222 is, for example, a window comparator.

The communication unit 230 transmits the sensor value obtained by the calculator 130 of the sensor module 100 to the current controller 240. The communication unit 230 enables communication from the calculator 130 to the current controller 240 while insulating the calculator 130 and the current controller 240 from each other.

The current controller 240 operates with the power supply voltage V1 and outputs a PWM signal (a control signal) having a pulse width corresponding to the signal M2 output from the power supply monitoring unit 221 to the abnormality notification unit 250. Specifically, in a case in which the signal M2 output from the power supply monitoring unit 221 is at a High level, the current controller 240 outputs the PWM signal having a pulse width corresponding to the sensor value obtained from the calculator 130 via the communication unit 230. For example, this PWM signal is for causing the current output unit 260 to output a current in a range of 4 to 20 mA to the two transmission lines L1 and L2.

On the other hand, in a case in which the signal M2 output from the power supply monitoring unit 221 is at a Low level (in the case of the second abnormality signal), the current controller 240 outputs a PWM signal (a second signal) having a pulse width different from the pulse width that can be obtained according to the sensor value obtained from the calculator 130. This PWM signal is for causing the current output unit 260 to output the burnout current (for example, a current of 3.6 mA or less or a current of 21.6 mA or more) to the two transmission lines L1 and L2.

The current controller 240 is a digital circuit and may include a processor and a non-volatile or volatile semiconductor memory. Examples of the above processor include a central processing unit (CPU), a micro processing unit (MPU), and the like. Examples of the above semiconductor memory include a random access memory (RAM), a read only memory (ROM), a flash memory, an erasable programmable read only memory (EPROM), an electrically erasable programmable read only memory (EEPROM), and the like. The current controller 240 may be a microcontroller such as a micro control unit (MCU).

The abnormality notification unit 250 includes a clock signal generator 251, a pulse signal generator 252, and a signal selector 253 and switches the signals to be output to the current output unit 260 according to the signal M1 output from the power supply monitoring unit 220 and the signal M2 output from the power supply monitoring unit 221. Specifically, the abnormality notification unit 250 outputs a clock signal CLK output from the clock signal generator 251, a pulse signal P output from the pulse signal generator 252, or the PWM signal output from the current controller 240 to the current output unit 260 according to the signals M1 and M2.

The clock signal generator 251 generates the clock signal CLK (a third signal) necessary for an operation of the current controller 240. The pulse width of the clock signal CLK is set such that a duty ratio is, for example, 50%. That is, the pulse width of the clock signal CLK is set such that, for example, an intermediate current (12 mA) in a range of 4 to 20 mA flows if the clock signal CLK has been supplied to the current output unit 260. This intermediate current is a current (a starting current) necessary for starting the field device 1. The clock signal generator 251 outputs the generated clock signal CLK to the signal selector 253 and the current controller 240.

The pulse signal generator 252 includes, for example, an oscillation circuit and generates the pulse signal P (a first signal) having a pulse width (a duty ratio) different from that of the clock signal CLK. For example, the pulse signal generator 252 generates the pulse signal P having the same pulse width as the pulse width of the PWM signal output from the current controller 240 to output the burnout current described above from the current output unit 260 to the two transmission lines L1 and L2. That is, the pulse signal generator 252 outputs the pulse signal P having a pulse width different from the pulse width that can be obtained according to the sensor value obtained from the calculator 130 in the current controller 240. The pulse signal generator 252 outputs the generated pulse signal P to the signal selector 253.

The signal selector 253 selects a signal to be output to the current output unit 260 from among the clock signal CLK, the pulse signal P, and the PWM signal (the PWM signal output from the current controller 240) according to the signals M1 and M2. Specifically, the signal selector 253 selects the PWM signal in a case in which the signal M1 is at a High level. The signal selector 253 selects the pulse signal P in a case in which the signal M1 is at a Low level and the signal M2 is at a High level. The signal selector 253 selects the clock signal CLK in a case in which both the signals M1 and M2 are at a Low level.

Specifically, the signal selector 253 includes an OR gate 254, a first selector 255, and a second selector 256. The OR gate 254 calculates a logical sum of the signal M1 output from the power supply monitoring unit 220 and the signal M2 output from the power supply monitoring unit 221. The first selector 255 selects either the clock signal CLK or the pulse signal P based on the calculation result of the OR gate 254 (hereinafter referred to as a "selection signal SL1"). Specifically, the first selector 255 selects the pulse signal P in a case in which the selection signal SL1 is at a High level and selects the clock signal CLK in a case in which the selection signal SL1 is at a Low level.

The second selector 256 selects any one of the signal selected by the first selector 255 and the PWM signal from the current controller 240 based on the signal M1 output from the power supply monitoring unit 220 (hereinafter, the signal M1 input to the second selector 256 is referred to as a "selection signal SL2"). Specifically, the second selector 256 selects the PWM signal in a case in which the selection signal SL2 is at a High level and selects the signal selected by the first selector 255 in a case in which the selection signal SL2 is at a Low level. The signal selected by the second selector 256 is input to the current output unit 260.

The current output unit 260 outputs a current having a magnitude corresponding to the signal selected by the second selector 256 (hereinafter referred to as a current signal Iout) to the two transmission lines L1 and L2. Specifically, the current output unit 260 outputs the current signal Iout having a magnitude corresponding to the pulse width (the duty ratio) of the signal selected by the second selector 256. For example, in a case in which the signal selected by the second selector 256 is a PWM signal output from the current controller 240 and having a pulse width corresponding to the sensor value obtained from the calculator 130, the current output unit 260 outputs, for example, a current signal Iout in a range of 4 to 20 mA.

Further, for example, in a case in which the signal selected by the second selector 256 is a PWM signal output from the current controller 240 and having a pulse width different from the pulse width that can be obtained according to the sensor value obtained from the calculator 130, the current output unit 260 outputs a burnout current (for example, a current of 3.6 mA or less or a current of 21.6 mA or more) as the current signal Iout. Similarly, even in a case in which the signal selected by the second selector 256 is the pulse signal P, the current output unit 260 outputs the burnout current as the current signal Iout. Further, in a case in which the signal selected by the second selector 256 is the clock signal CLK, the current output unit 260 outputs an intermediate current (12 mA) in a range of 4 to 20 mA as the current signal Iout.

<Operations of Field Device>

Figure 2:
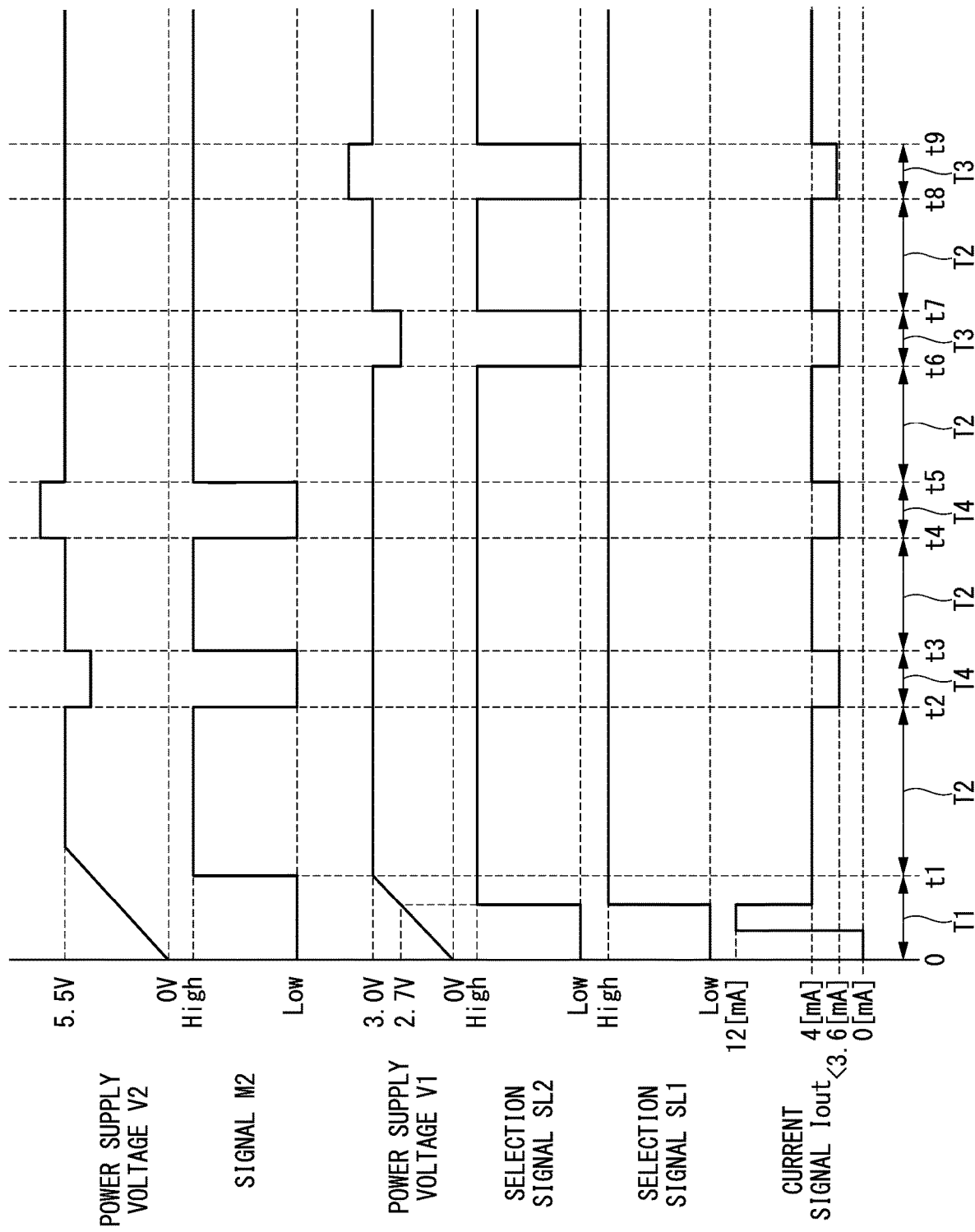
FIG. 2 is a timing chart of various signals of the field device according to the first embodiment of the present invention.

Next, operations of the field device 1 according to the first embodiment of the present invention will be described. In the following, an operation when the field device 1 starts (an operation at the time of starting), an operation when the power supply voltage V1 and the power supply voltage V2 are normal (a normal operation), an operation when an abnormality occurs in the power supply voltage V1 (an operation at the time of an abnormality of the power supply voltage V1), and an operation when an abnormality occurs in the power supply voltage V2 (an operation at the time of an abnormality of the power supply voltage V2) will be described in order. FIG. 2 is a timing chart of various signals of the field device according to the first embodiment of the present invention. FIG. 3 is a diagram showing states of various signals of the field device according to the first embodiment of the present invention.

<<Operation at the Time of Starting>>

A period T1 shown in FIG. 2 is a period during which an operation at the time of starting the field device 1 is performed. As shown in FIG. 2, immediately after power is applied to the field device 1, both the power supply voltages V1 and V2 are under-voltages. Therefore, as shown in FIG. 3, both the signals M1 and M2 are Low level signals, and both the selection signals SL1 and SL2 are also Low level signals. As a result, the first selector 255 selects the clock signal CLK and outputs it to the second selector 256. Further, since the selection signal SL2 is at a Low level, the second selector 256 selects the clock signal CLK output from the first selector 255 and outputs it to the current output unit 260. As a result, the starting current (for example, 12 mA) of the field device 1 is output from the current output unit 260. In other words, the starting current necessary for starting the field device 1 is supplied from the external device C via the two transmission lines L1 and L2. When the power supply voltage V1 exceeds the above-mentioned lower limit threshold value Vth12 (for example, 2.7 V), the starting of the field device 1 is completed.

<<Normal Operation>>

A period T2 shown in FIG. 2 is a period during which a normal operation of the field device 1 is performed. When the starting of the field device 1 is completed, the power supply voltage V1 is in the first voltage range, and the power supply voltage V2 is in the second voltage range. Therefore, as shown in FIG. 3, both the signals M1 and M2 are High level signals, and the selection signals SL1 and SL2 are also High level signals. Here, in a case in which the selection signal SL2 is a High level signal, the second selector 256 outputs the PWM signal regardless of the output of the first selector 255. As a result, the current output unit 260 outputs a current in a range of, for example, 4 to 20 mA according to the pulse width of the PWM signal. As a result, the sensor value can be transmitted to the external device C.

<<Operation at the Time of Abnormality of Power Supply Voltage V1>>

A period T3 shown in FIG. 2 is a period during which an operation at the time of an abnormality of the power supply voltage V1 is performed. In a case in which an abnormality occurs in the power supply circuit 210 and the power supply voltage V1 falls below the lower limit threshold value Vth12, the signal M1 output from the power supply monitoring unit 220 becomes a Low level signal. However, since the power supply circuit 211 is operating normally, the signal M2 remains at a High level. Therefore, as shown in FIG. 3, the selection signal SL1 is a High level signal, and the selection signal SL2 is a Low level signal. Thus, the first selector 255 selects the pulse signal P and outputs it to the second selector 256. Further, since the selection signal SL2 is at a Low level, the second selector 256 selects the pulse signal P and outputs it to the current output unit 260. As a result, the burnout current (for example, a current of 3.6 mA or less) is output from the current output unit 260. Thereby, an abnormality of the power supply voltage generated in the field device 1 can be notified to the external device C. The operation at the time of an abnormality of the power supply voltage V1 is performed not only in a case in which the power supply voltage V1 falls below the lower limit threshold value Vth12 but also in a case in which the power supply voltage V1 exceeds the upper limit threshold value Vth11.

<<Operation at the Time of Abnormality of Power Supply Voltage V2>>

A period T4 shown in FIG. 2 is a period during which an operation at the time of an abnormality of the power supply voltage V2 is performed. In a case in which an abnormality occurs in the power supply circuit 211 and the power supply voltage V2 falls below the lower limit threshold value Vth22, the signal M2 output from the power supply monitoring unit 221 becomes a Low level signal. However, since the power supply circuit 210 is operating normally, the signal M1 remains at a High level. Therefore, as shown in FIG. 3, both the selection signals SL1 and SL2 are High level signals. Here, in a case in which the selection signal SL2 is a High level signal, the second selector 256 outputs the PWM signal to the current output unit 260 regardless of the output of the first selector 255. Further, since the signal M2 output from the power supply monitoring unit 221 is at a Low level, the current controller 240 outputs a PWM signal having a pulse width different from the pulse width that can be obtained according to the sensor value obtained from the calculator 130. As a result, the burnout current (for example, a current of 3.6 mA or less) is output from the current output unit 260. Thereby, an abnormality of the power supply voltage generated in the field device 1 can be notified to the external device C. The operation at the time of an abnormality of the power supply voltage V2 is performed not only in a case in which the power supply voltage V2 falls below the lower limit threshold value Vth22 but also in a case in which the power supply voltage V2 exceeds the upper limit threshold value Vth21.

As described above, the field device 1 of the present embodiment includes: the current controller 240 that operates with the power supply voltage V1 and outputs a control signal for controlling a current to be output to the two transmission lines L1 and L2; the current output unit 260 that operates with the power supply voltage V2 and outputs a current of a magnitude corresponding to the control signal output from the current controller 240 to the two transmission lines L1 and L2; and the abnormality notification unit 250 that outputs the pulse signal P for causing the current output unit 260 to output a burnout current indicating that an abnormality has occurred to the current output unit 260 in a case in which an abnormality occurs in the power supply voltage V1. As a result, even in a case in which an abnormality occurs in a power supply voltage V1 which is supplied to the current controller 240, it is possible to notify the external device C that an abnormality has occurred.

Further, in the present embodiment, the power supply monitoring unit 220 monitors an over-voltage and an under-voltage of the power supply voltage V1 as an abnormality of the power supply voltage V1, and the power supply monitoring unit 221 monitors an over-voltage and an under-voltage of the power supply voltage V2 as an abnormality of the power supply voltage V2. As a result, not only in a case in which the power supply voltages V1 and V2 become the under-voltages but also in a case in which the power supply voltages V1 and V2 become the over-voltages, it is possible to notify the external device C that an abnormality has occurred in the field device 1.

Second Embodiment

<Field Device>

Figure 4:
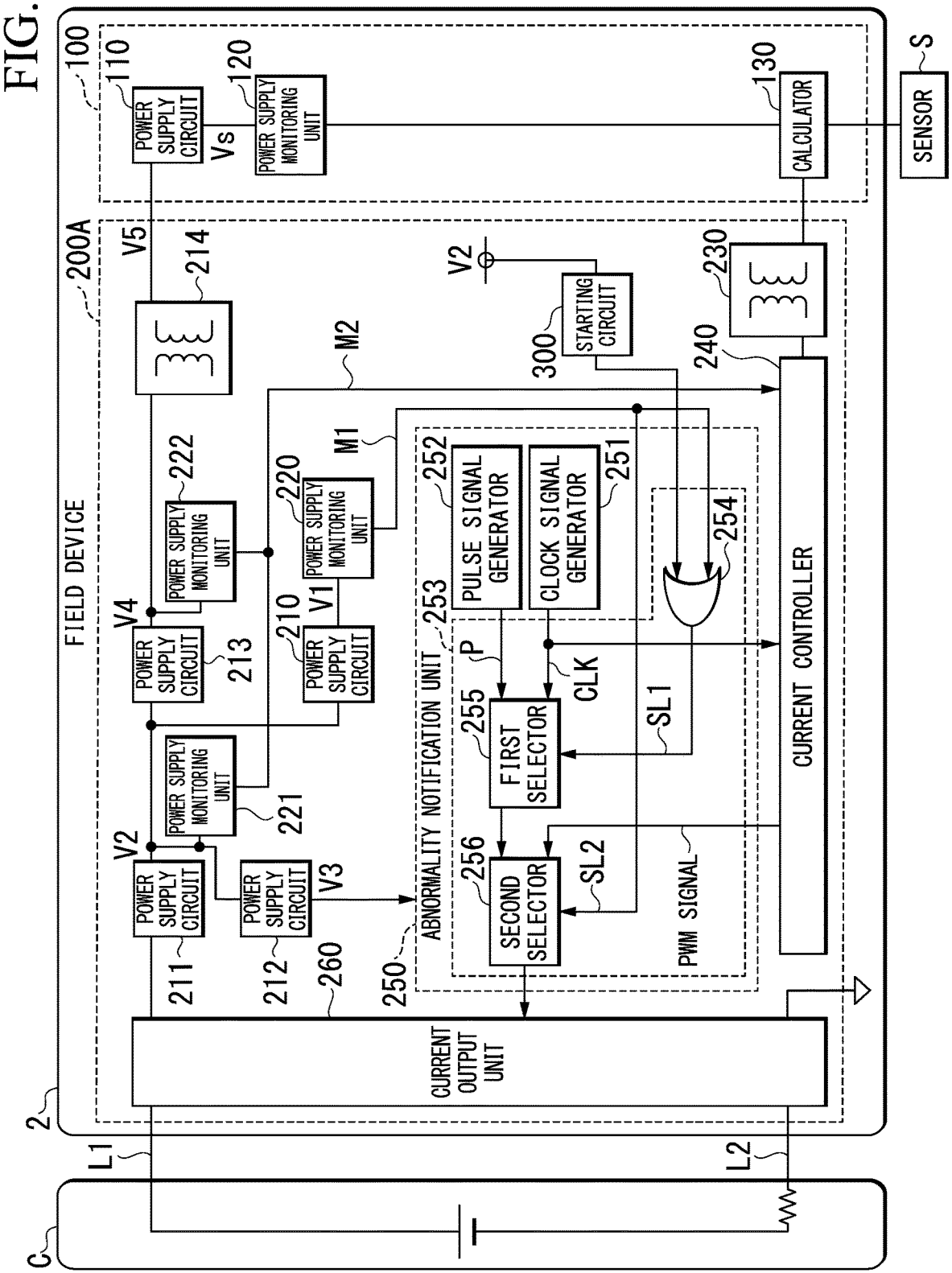
FIG. 4 is a block diagram showing main constituent elements of a field device according to a second embodiment of the present invention.

FIG. 4 is a block diagram showing main constituent elements of a field device according to a second embodiment of the present invention. In FIG. 4, the same reference signs are given to the constituent elements similar to those shown in FIG. 1. As shown in FIG. 4, a field device 2 of the present embodiment has a configuration in which the transmitter 200 of the field device 1 shown in FIG. 1 is changed to a transmitter 200A. In such a field device 2, even in a case in which the power supply voltage V2 decreases as the power supply voltage V1 decreases due to a short circuit of the power supply circuit 210 or the like, it is possible to notify the external device C that an abnormality has occurred in the field device 2.

Here, in the field device 1 of the first embodiment described above, in a case in which the power supply voltages V1 and V2 are under-voltages and the signals M1 and M2 are both Low level signals, a starting current is output from the current output unit 260. Therefore, if the power supply voltage V2 decreases as the power supply voltage V1 decreases due to a short circuit of the power supply circuit 210 or the like, even though a power supply abnormality occurs, the current output unit 260 outputs a starting current and does not output a burnout current. In the field device 2 of the present embodiment, the transmitter 200A is provided instead of the transmitter 200 of the field device 1, and thus in a case in which the power supply voltage V2 decreases as the power supply voltage V1 decreases due to a short circuit of the power supply circuit 210 or the like, the burnout current is output.

The transmitter 200A is one obtained by adding a starting circuit 300 to the transmitter 200 shown in FIG. 1, and the output of the starting circuit 300 is connected to one input end of the OR gate 254 (an input end to which the signal M2 is input). The starting circuit 300 is a circuit having hysteresis for inputting the power supply voltage V2 generated by the power supply circuit 211. The starting circuit 300 generates a High level signal in a case in which the power supply voltage V2 exceeds an upper limit threshold value Vth41 and generates a Low level signal in a case in which the power supply voltage V2 falls below the upper limit threshold value Vth42. The starting circuit 300 is, for example, a hysteresis comparator, a Schmitt trigger, or the like. The signal M2 generated by the power supply monitoring unit 221 is output to the current controller 240.

Figure 5:
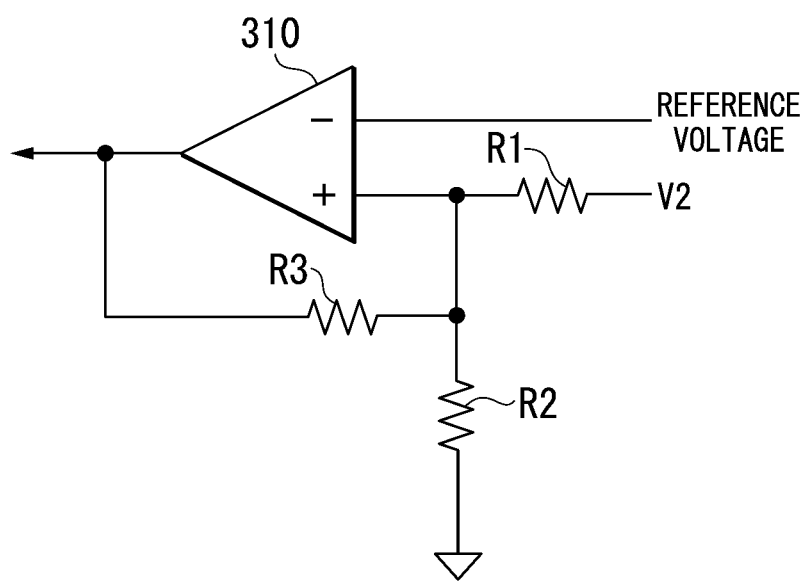
FIG. 5 is a circuit diagram showing an example of a starting circuit provided in the field device according to the second embodiment of the present invention.

FIG. 5 is a circuit diagram showing an example of the starting circuit provided in the field device according to the second embodiment of the present invention. The starting circuit 300 illustrated in FIG. 5 is a non-inverting hysteresis comparator. The starting circuit 300 shown in FIG. 5 includes a comparator 310 and resistors R1 to R3. The resistor R1 is connected to a non-inverting input end of the comparator 310, the resistor R2 is connected between the non-inverting input end of the comparator 310 and a ground, and the resistor R3 is connected between the non-inverting input end and an output end of the comparator 310. A reference voltage (for example, 2.5 V) is input to an inverting input end of the comparator 310, and the power supply voltage V2 is input to the non-inverting input end of the comparator 310 via the resistor R1. A hysteresis width of the starting circuit 300 is defined by resistance values of the resistors R1 to R3, a reference voltage, and the like.

<Operations of Field Device>

The signal output from the comparator 310 does not immediately become a Low level signal even if the power supply voltage V2 which is input to the non-inverting input end decreases and becomes a Low level signal after a time corresponding to the hysteresis width of the starting circuit 300 has elapsed. Therefore, even if the power supply voltage V2 decreases as the power supply voltage V1 decreases due to a short circuit of the power supply circuit 210 or the like, the signal output from the starting circuit 300 (the signal which is input to the one input end of the OR gate 254) is maintained at High level for a certain period of time. As a result, the burnout current can be output from the current output unit 260.

Operations of the field device 2 (an operation at the time of starting, a normal operation, an operation at the time of an abnormality of the power supply voltage V1, and an operation at the time of an abnormality of the power supply voltage V2) are basically the same as those of the field device 1 of the first embodiment. Therefore, detailed description thereof will be omitted here.

As described above, the field device 2 of the present embodiment has a basic configuration which is the same as that of the field device 1 of the first embodiment except that the starting circuit 300 is provided in the field device 1 of the first embodiment. Therefore, also in the present embodiment, even in a case in which an abnormality occurs in a power supply voltage V1 which is supplied to the current controller 240, it is possible to notify the external device C that an abnormality has occurred. Further, not only in a case in which the power supply voltages V1 and V2 become the under-voltages but also in a case in which the power supply voltages V1 and V2 become the over-voltages, it is possible to notify the external device C that an abnormality has occurred in the field device 2. In addition, in the present embodiment, even if the power supply voltage V2 decreases as the power supply voltage V1 decreases due to a short circuit of the power supply circuit 210 or the like, the burnout current can be output from the current output unit 260.

Third Embodiment

<Field Device>

Figure 6:
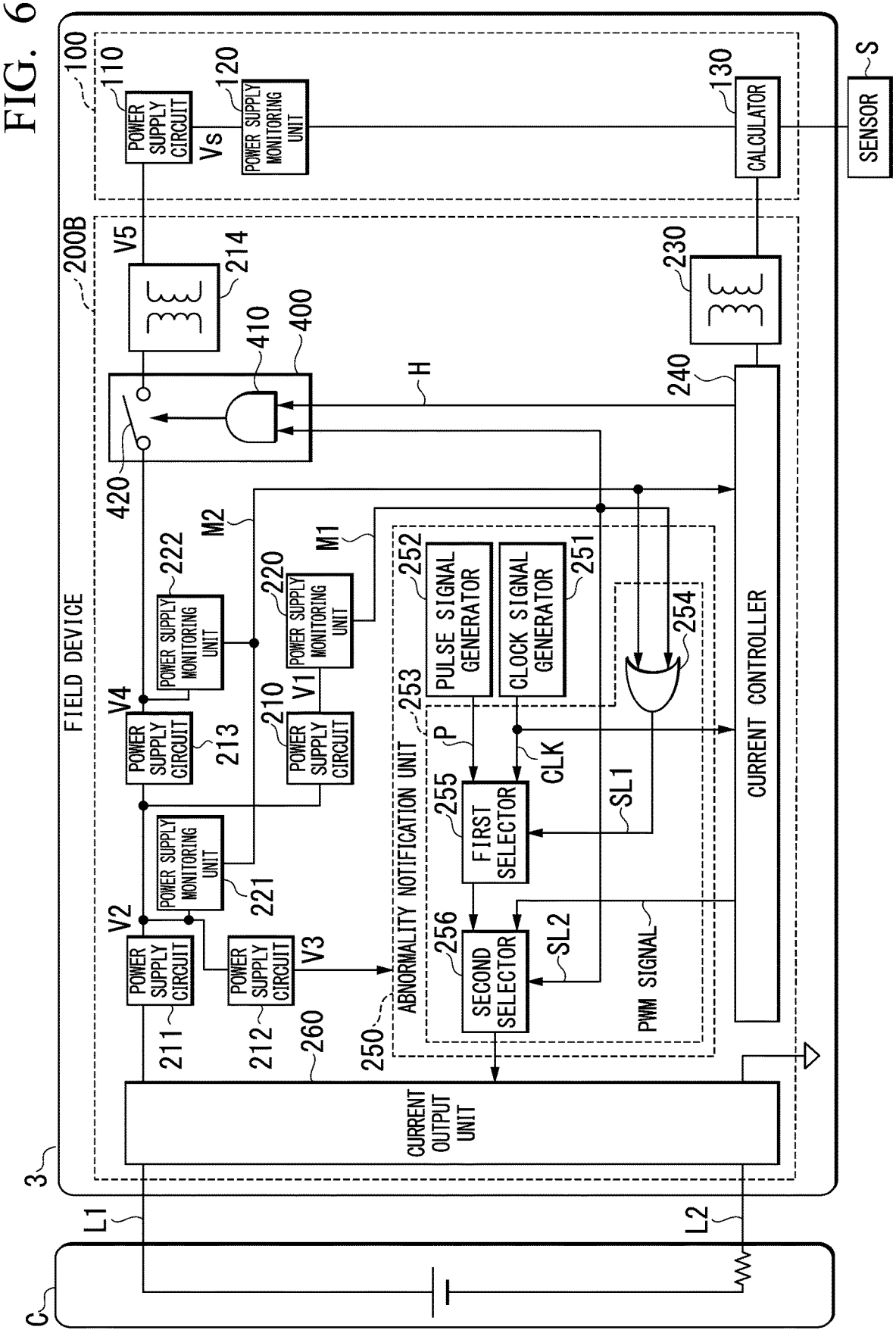
FIG. 6 is a block diagram showing main constituent elements of a field device according to a third embodiment of the present invention.

FIG. 6 is a block diagram showing main constituent elements of a field device according to a third embodiment of the present invention. In FIG. 6, the same reference signs are given to the constituent elements similar to those shown in FIG. 1. As shown in FIG. 6, a field device 3 of the present embodiment has a configuration in which the transmitter 200 of the field device 1 shown in FIG. 1 is changed to a transmitter 200B. Such a field device 3 is intended to reduce the amount of power consumed when outputting the burnout current.

Here, in the field device 1 of the first embodiment described above, in a case in which an abnormality occurs in the power supply voltages V1 and V2, a burnout current (for example, a current of 3.6 mA or less) is output. While the burnout current is being output, the field device 1 has to operate with the power corresponding to the burnout current (for example, a current of 3.6 mA or less), and it is considered that the power is insufficient. In the field device 3 of the present embodiment, the transmitter 200B is provided instead of the transmitter 200 of the field device 1, and thus, the power consumption of the field device 3 is reduced.

The transmitter 200B has a configuration in which a power supply cutoff unit 400 is added to the transmitter 200 shown in FIG. 1. In a case in which an abnormality occurs in any of the power supply voltages V1 and V2, the power supply cutoff unit 400 cuts off the power supply to the electronic component (for example, the sensor module 100) unnecessary for the output of the burnout signal. As shown in FIG. 6, the power supply cutoff unit 400 includes an AND gate 410 and a switch 420.

The AND gate 410 calculates a logical product of the signal M1 output from the power supply monitoring unit 220 and a signal H output from the current controller 240. The signal H is a signal that becomes a High level signal in a case in which the power supply voltage V2 is normal and becomes a Low level signal in a case in which the power supply voltage V2 is abnormal, like the signal M2 output from the power supply monitoring unit 221. The switch 420 is connected between the power supply circuit 213 and the power supply circuit 214 and is turned on or off according to the signal from the AND gate 410. Specifically, in a case in which the signal from the AND gate 410 is at the High level, the switch 420 is turned on, and in a case in which the signal from the AND gate 410 is at the Low level, the switch 420 is turned off. In a case in which the switch 420 is turned on, the power supply circuit 213 and the power supply circuit 214 are electrically connected to each other, and in a case in which the switch 420 is turned off, the electrical connection between the power supply circuit 213 and the power supply circuit 214 is cut off.

<Operations of Field Device>

In a case in which the power supply circuit 210 and the power supply circuit 211 are operating normally (for example, in a case in which a normal operation is performed), both the signal M1 output from the power supply monitoring unit 220 and the signal M2 output from the power supply monitoring unit 221 are at a High level. Therefore, the High level signal M1 and the High level signal H are input to the AND gate 410, and the High level signal is output from the AND gate 410 to the switch 420. As a result, the switch 420 is turned on, and the power supply voltage V4 is supplied from the power supply circuit 213 to the power supply circuit 214.

In a case in which an abnormality occurs in the power supply circuit 210 and the power supply circuit 211 are operating normally (in a case in which an operation at the time of an abnormality of the power supply voltage V1 is performed), the signal M1 output from the power supply monitoring unit 220 is at a Low level, and the signal M2 output from the power supply monitoring unit 221 is at a High level. Therefore, the Low level signal M1 and the High level signal H are input to the AND gate 410, and the Low level signal is output from the AND gate 410 to the switch 420. As a result, the switch 420 is turned off, and the supply of the power supply voltage V4 from the power supply circuit 213 to the power supply circuit 214 is cut off.

In this case, since the signal M1 output from the power supply monitoring unit 220 is at a Low level and the signal M2 output from the power supply monitoring unit 221 is at a High level, the pulse signal P output from the pulse signal generator 252 is input to the current output unit 260 (see FIG. 3). As a result, the burnout current (for example, a current of 3.6 mA or less) is output from the current output unit 260. In this way, in a case in which the external device C is notified of an abnormality of the power supply voltage V1 that has occurred in the field device 3, the supply of the power supply voltage V4 from the power supply circuit 213 to the power supply circuit 214 is cut off, and thus the power consumption of the field device 3 is suppressed.

In a case in which the power supply circuit 210 are operating normally and an abnormality occurs in the power supply circuit 211 (in a case in which an operation at the time of an abnormality of the power supply voltage V2 is performed), the signal M1 output from the power supply monitoring unit 220 is at a High level, and the signal M2 output from the power supply monitoring unit 221 is at a Low level. Therefore, the High level signal M1 and the Low level signal H are input to the AND gate 410, and the Low level signal is output from the AND gate 410 to the switch 420. As a result, the switch 420 is turned off, and the supply of the power supply voltage V4 from the power supply circuit 213 to the power supply circuit 214 is cut off.

In this case, since the signal M1 output from the power supply monitoring unit 220 is at a High level and the signal M2 output from the power supply monitoring unit 221 is at a Low level, the current controller 240 outputs a PWM signal having a pulse width different from the pulse width that can be obtained according to the sensor value obtained from the calculator 130 (see FIG. 3). As a result, the burnout current (for example, a current of 3.6 mA or less) is output from the current output unit 260. In this way, in a case in which the external device C is notified of an abnormality of the power supply voltage V1 that has occurred in the field device 3, the supply of the power supply voltage V4 from the power supply circuit 213 to the power supply circuit 214 is cut off, and thus the power consumption of the field device 3 is suppressed.

In a case in which an abnormality occurs in the power supply circuit 210 and the power supply circuit 211 (including a case in which an operation at the time of the starting is performed), both the signal M1 output from the power supply monitoring unit 220 and the signal M2 output from the power supply monitoring unit 221 are at a Low level. Therefore, the Low level signal M1 and the Low level signal H are input to the AND gate 410, and the Low level signal is output from the AND gate 410 to the switch 420. As a result, the switch 420 is turned off, and the supply of the power supply voltage V4 from the power supply circuit 213 to the power supply circuit 214 is cut off.

As described above, the field device 3 of the present embodiment has a basic configuration which is the same as that of the field device 1 of the first embodiment except that the power supply cutoff unit 400 is provided in the field device 1 of the first embodiment. Therefore, also in the present embodiment, even in a case in which an abnormality occurs in a power supply voltage V1 which is supplied to the current controller 240, it is possible to notify the external device C that an abnormality has occurred. Further, not only in a case in which the power supply voltages V1 and V2 become the under-voltages but also in a case in which the power supply voltages V1 and V2 become the over-voltages, it is possible to notify the external device C that an abnormality has occurred in the field device 3. In addition, in the present embodiment, it is possible to reduce the power consumption of the field device 3 in a case in which the burnout current is output.

Fourth Embodiment

<Field Device>

FIG. 7 is a block diagram showing main constituent elements of a field device according to a fourth embodiment of the present invention. In FIG. 7, the same reference signs are given to the constituent elements similar to those shown in FIG. 1. As shown in FIG. 7, a field device 4 of the present embodiment has a configuration in which the transmitter 200 of the field device 1 shown in FIG. 1 is changed to a transmitter 200C separated from the sensor module 100. In such a field device 4, in a case in which an abnormality of the power supply voltage occurs on a secondary side of the power supply circuit 214, it is possible to notify the external device C that an abnormality has occurred in the field device 4.

As shown in FIG. 7, the sensor module 100 and the transmitter 200C of the field device 4 are separated from each other and are connected to each other via two cables L3. The transmission unit 200C has a configuration in which a power supply monitoring unit 500 is added to the transmitter 200 shown in FIG. 1 and the current controller 240 is changed to a current controller 240C. The power supply monitoring unit 500 (a third power supply monitoring unit) monitors the power supply voltage V5 and stops an operation of the communication unit 230 in a case in which the power supply voltage V5 is out of a fifth voltage range. An abnormality of the power supply voltage V5 occurs when the power supply voltage V5 is an over-voltage or an under-voltage.

Here, the above fifth voltage range is a range between an upper limit threshold value Vth51 and a lower limit threshold value Vth52. In a case in which the power supply voltage V5 exceeds the upper limit threshold value Vth51, the power supply monitoring unit 500 stops the operation of the communication unit 230 assuming that the power supply voltage V5 is an over-voltage. Further, in a case in which the power supply voltage V5 is less than the lower limit threshold value Vth52, the power supply monitoring unit 500 stops the operation of the communication unit 230 assuming that the power supply voltage V5 is an under-voltage.

The current controller 240C is one obtained by providing a function of detecting a communication state of the communication unit 230 in the current controller 240 shown in FIG. 1. For example, the current controller 240C uses a cyclic redundancy check (CRC) function to check whether or not the communication unit 230 is operating normally. In a case in which a communication error of the communication unit 230 is detected, the current controller 240C determines that the communication unit 230 is not operating normally. In a case in which the communication unit 230 is not operating normally, the current controller 240C outputs the PWM signal (the second signal) having a pulse width different from the pulse width that can be obtained according to the sensor value obtained from the calculator 130.

<Operations of Field Device>

In a case in which the field device 4 is installed in a plant, a factory, or the like, the sensor module 100 may be disposed at a position different from that of the transmitter 200C. In this case, the transmitter 200C and the sensor module 100 are connected to each other via the cables L3. Here, in a case in which an abnormality of the power supply voltage V5 occurs, the power supply monitoring unit 500 stops the operation of the communication unit 230. Then, the current controller 240C determines that the communication unit 230 is not operating normally and outputs the PWM signal having a pulse width different from the pulse width that can be obtained according to the sensor value obtained from the calculator 130. As a result, the burnout current (for example, a current of 3.6 mA or less) is output from the current output unit 260. In this way, even in a case in which an abnormality of the power supply voltage occurs on a secondary side of the power supply circuit 214, it is possible to notify the external device C that an abnormality has occurred in the field device 4.

Here, in a case in which an abnormality of the power supply voltage V5 occurs, the sensor module 100 may notify the current controller 240C of the occurrence of the abnormality via the communication unit 230. For example, in a case in which the power supply monitoring unit 500 detects an abnormality of the power supply voltage V5, the sensor module 100 may notify the abnormality. However, in this case, the sensor module 100 has to receive a signal indicating the presence or absence of an abnormality from the power supply monitoring unit 500 via the cable L3, and depending on the length of the cable L3, it may take a considerable time to notify the current controller 240C of the abnormality from the occurrence of the abnormality. Further, the cable L3 tends to be an intrusion path of a noise. Therefore, due to the noise, the power supply monitoring unit 500 may not correctly notify the sensor module of the abnormality, and the external device C may not be notified of the abnormality of the power supply voltage V5.

Therefore, in the field device 4 of the present embodiment, in a case in which an abnormality occurs in the power supply voltage which is supplied to the sensor module 100, a communication error such as interrupting the communication of the communication unit 230 in an analog manner and stopping the communication unit 230 is generated. As a result, an abnormality of the power supply voltage V5 can be reliably notified to the external device C.

As described above, the field device 4 of the present embodiment has a basic configuration which is the same as that of the field device 1 of the first embodiment except that the power supply monitoring unit 500 is provided in the field device 1 of the first embodiment and the current controller 240 is changed to the current controller 240C. Therefore, also in the present embodiment, even in a case in which an abnormality occurs in a power supply voltage V1 which is supplied to the current controller 240, it is possible to notify the external device C that an abnormality has occurred. Further, not only in a case in which the power supply voltages V1 and V2 become the under-voltages but also in a case in which the power supply voltages V1 and V2 become the over-voltages, it is possible to notify the external device C that an abnormality has occurred in the field device 4. In addition, in the present embodiment, even in a case in which an abnormality of the power supply voltage occurs on a secondary side of the power supply circuit 214, it is possible to notify the external device C that an abnormality has occurred in the field device 4.

Although the field devices according to the embodiments of the present invention have been described above, the present invention is not limited to the above embodiments and can be freely changed within the scope of the present invention. For example, the above-described first to fourth embodiments can be combined with each other as appropriate. For example, the field device 3 of the third embodiment and the field device 4 of the fourth embodiment may include the starting circuit 300 included in the field device 2 of the second embodiment.

Further, in the above-described embodiments, it is described that the power supply voltage V1 is the first power supply voltage and the power supply voltage V2 is the second power supply voltage. However, the second power supply voltage may be different from the first power supply voltage. For example, the second power supply voltage may be higher than the first power supply voltage. As an example, the second power supply voltage may be the power supply voltage V4.

Further, in the above-described embodiments, the field devices 1 to 4 have been described as being separate from the sensor S. However, the field devices 1 to 4 may have the sensor S. For example, the field devices 1 to 4 may be vortex flow meters, temperature sensors, valve devices such as flow control valves and on-off valves, actuator devices such as fans and motors, and other devices which are installed at a field of a plant.

Here, examples of the plant at which field devices 1 to 4 are installed include an industrial plant such as a chemical plant, a plant that manages and controls a well site such as a gas field and an oil field and their surroundings, a plant that manages and controls power generation such as hydraulic power, thermal power, and nuclear power, a plant that manages and controls environmental power generation such as solar power and wind power, and a plant that manages and controls water supply and drainage and a dam. It should be noted that the above plants are merely examples and the present invention is not limited to the above plants.

(Supplementary Note)

The field device (1, 2, 3, 4) according to an aspect of the present invention includes: a current controller (240, 240C) configured to operate with a first power supply voltage (V1) and output a control signal for controlling a current to be output to a transmission line (L1, L2); a current output unit (260) configured to operate with a second power supply voltage (V2) different from the first power supply voltage, the current output unit being capable of outputting a current of a magnitude corresponding to the control signal output from the current controller to the transmission line; and an abnormality notification unit (250) configured to output, to the current output unit, a first signal (P) for causing the current output unit to output a burnout current indicating that an abnormality has occurred in a case in which an abnormality occurs in the first power supply voltage.

Further, in the field device according to the aspect of the present invention, in a case in which an abnormality occurs in the second power supply voltage, the current controller outputs, as the control signal, a second signal for causing the current output unit to output the burnout current.

Further, the field device according to the aspect of the present invention further includes: a first power supply monitoring unit (220) configured to output a first abnormality signal indicating an abnormality of the first power supply voltage in a case in which the first power supply voltage is out of a predetermined first voltage range; and a second power supply monitoring unit (221) configured to output a second abnormality signal indicating an abnormality of the second power supply voltage in a case in which the second power supply voltage is out of a predetermined second voltage range.

Further, in the field device according to the aspect of the present invention, in a case in which the first abnormality signal is input and the second abnormality signal is not input, the abnormality notification unit outputs the first signal to the current output unit.

Further, in the field device according to the aspect of the present invention, in a case in which the first abnormality signal is not input and the second abnormality signal is input, the abnormality notification unit outputs the second signal to the current output unit.

Alternatively, in the field device according to the aspect of the present invention, in a case in which the first abnormality signal is input and the second abnormality signal is input, the abnormality notification unit outputs a third signal for causing the current output unit to output a starting current which is a current necessary for starting the field device to the current output unit.

Further, the field device according to the aspect of the present invention further includes a starting circuit (300) configured to delay an input of the second abnormality signal with respect to the abnormality notification unit for a certain period of time.

Further, the field device according to the aspect of the present invention further includes: a sensor module (100) configured to operate with a third power supply voltage different from the first power supply voltage and the second power supply voltage, the sensor module being configured to output a sensor value indicating a measurement result of a sensor (S), wherein the current controller outputs, as the control signal, a PWM (Pulse Width Modulation) signal having a pulse width corresponding to the sensor value output from the sensor module, and wherein the current output unit outputs a current corresponding to the pulse width of the PWM signal to the transmission line.

Further, in the field device according to the aspect of the present invention, the first signal and the second signal are signals having a pulse width different from the pulse width that can be obtained according to the sensor value output from the sensor module.

Further, the field device according to the aspect of the present invention further includes: a communication unit (230) configured to perform communication between the sensor module and the current controller; and a third power supply monitoring unit (500) configured to stop an operation of the communication unit in a case in which an abnormality occurs in the third power supply voltage, wherein, in a case in which the communication unit stops operating, the current controller outputs the second signal.

Further, the field device according to the aspect of the present invention further includes a power supply cutoff unit (400) configured to cut off supply of at least the third power supply voltage with respect to the sensor module in a case in which an abnormality occurs in the first power supply voltage or the second power supply voltage.

Further, in the field device according to the aspect of the present invention, the abnormality notification unit includes: a pulse signal generator (252) configured to generate a pulse signal; and a clock signal generator (251) configured to generate a clock signal, wherein the first signal is the pulse signal generated by the pulse signal generator, and wherein the third signal is the clock signal generated by the clock signal generator.

Further, in the field device according to the aspect of the present invention, the abnormality notification unit further includes a first selector (255) configured to select one of the pulse signal generated by the pulse signal generator and the clock signal generated by the clock signal generator.

Further, in the field device according to the aspect of the present invention, in a case in which the first abnormality signal is input and the second abnormality signal is input, the first selector selects the clock signal generated by the clock signal generator, and in the other case, the first selector selects the pulse signal generated by the pulse signal generator.

Further, the field device according to the aspect of the present invention further includes: a sensor module (100) configured to operate with a third power supply voltage different from the first power supply voltage and the second power supply voltage, the sensor module being configured to output a sensor value indicating a measurement result of a sensor, wherein the current controller outputs, as the control signal, a PWM signal having a pulse width corresponding to the sensor value output from the sensor module, and wherein the abnormality notification unit further includes: a second selector (256) configured to select one of the signal selected by the first selector and the PWM signal output from the current controller.

Further, in the field device according to the aspect of the present invention, the starting circuit is a hysteresis comparator or a Schmitt trigger.

Further, the field device according to the aspect of the present invention further includes: a transmitter (200) which includes the current controller, the current output unit, and the abnormality notification unit, wherein the transmitter is separated from the sensor module and connected to the sensor module via a cable (L3), and wherein the sensor module outputs the sensor value to the communication unit via the cable.

Further, in the field device according to the aspect of the present invention, the power supply cutoff unit includes: a switch (420) configured to be turned on in a case in which the first power supply voltage and the second power supply voltage are normal, and configured to be turned off in a case in which at least one of the first power supply voltage or the second power supply voltage is abnormal.

Further, in the field device according to the aspect of the present invention, in a case in which the switch is turned on, the third power supply voltage is supplied to the sensor module, and in a case in which the switch is turned off, supply of the third power supply voltage to the sensor module is cut off by the power supply cutoff unit.

Further, the field device according to the aspect of the present invention further includes: a first power supply circuit (210) configured to generate the first power supply voltage by stepping down the second power supply voltage; and a second power supply circuit (211) configured to generate the second power supply voltage from electric power which is supplied from an external device.

According to the present invention, there is an effect that it is possible to notify an external device that an abnormality has occurred even in a case in which an abnormality occurs in a power supply voltage which is supplied to a current controller that controls a current to be output to a transmission line.

As used herein, the following directional terms "front, back, above, downward, right, left, vertical, horizontal, below, transverse, row and column" as well as any other similar directional terms refer to those instructions of a device equipped with the present invention. Accordingly, these terms, as utilized to describe the present invention should be interpreted relative to a device equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A field device comprising:
   a current controller configured to operate with a first power supply voltage and output a control signal for controlling a current to be output to a transmission line;
   a current output unit configured to operate with a second power supply voltage different from the first power supply voltage, the current output unit being capable of outputting a current of a magnitude corresponding to the control signal output from the current controller to the transmission line; and
   an abnormality notification unit configured to output, to the current output unit, a first signal for causing the current output unit to output a burnout current indicating that an abnormality has occurred in a case in which an abnormality occurs in the first power supply voltage.

2. The field device according to claim 1,
   wherein, in a case in which an abnormality occurs in the second power supply voltage, the current controller outputs, as the control signal, a second signal for causing the current output unit to output the burnout current.

3. The field device according to claim 2, further comprising:
   a first power supply monitoring unit configured to output a first abnormality signal indicating an abnormality of the first power supply voltage in a case in which the first power supply voltage is out of a predetermined first voltage range; and
   a second power supply monitoring unit configured to output a second abnormality signal indicating an abnormality of the second power supply voltage in a case in which the second power supply voltage is out of a predetermined second voltage range.

4. The field device according to claim 3,
   wherein, in a case in which the first abnormality signal is input and the second abnormality signal is not input, the abnormality notification unit outputs the first signal to the current output unit.

5. The field device according to claim 3,
   wherein, in a case in which the first abnormality signal is not input and the second abnormality signal is input, the abnormality notification unit outputs the second signal to the current output unit.

6. The field device according to claim 3,
   wherein, in a case in which the first abnormality signal is input and the second abnormality signal is input, the abnormality notification unit outputs a third signal for causing the current output unit to output a starting current which is a current necessary for starting the field device to the current output unit.

7. The field device according to claim 6,
   wherein the abnormality notification unit comprises:
   a pulse signal generator configured to generate a pulse signal; and
   a clock signal generator configured to generate a clock signal,
   wherein the first signal is the pulse signal generated by the pulse signal generator, and wherein the third signal is the clock signal generated by the clock signal generator.

8. The field device according to claim 7, wherein the abnormality notification unit further comprises:
  a first selector configured to select one of the pulse signal generated by the pulse signal generator and the clock signal generated by the clock signal generator.

9. The field device according to claim 8, wherein, in a case in which the first abnormality signal is input and the second abnormality signal is input, the first selector selects the clock signal generated by the clock signal generator, and in the other case, the first selector selects the pulse signal generated by the pulse signal generator.

10. The field device according to claim 8, further comprising:
  a sensor module configured to operate with a third power supply voltage different from the first power supply voltage and the second power supply voltage, the sensor module being configured to output a sensor value indicating a measurement result of a sensor,
  wherein the current controller outputs, as the control signal, a PWM signal having a pulse width corresponding to the sensor value output from the sensor module, and
  wherein the abnormality notification unit further comprises:
    a second selector configured to select one of the signal selected by the first selector and the PWM signal output from the current controller.

11. The field device according to claim 3, further comprising:
  a starting circuit configured to delay an input of the second abnormality signal with respect to the abnormality notification unit for a certain period of time.

12. The field device according to claim 11, wherein the starting circuit is a hysteresis comparator or a Schmitt trigger.

13. The field device according to claim 2, further comprising:
  a sensor module configured to operate with a third power supply voltage different from the first power supply voltage and the second power supply voltage, the sensor module being configured to output a sensor value indicating a measurement result of a sensor,
  wherein the current controller outputs, as the control signal, a PWM (Pulse Width Modulation) signal having a pulse width corresponding to the sensor value output from the sensor module, and
  wherein the current output unit outputs a current corresponding to the pulse width of the PWM signal to the transmission line.

14. The field device according to claim 13, wherein the first signal and the second signal are signals having a pulse width different from the pulse width that can be obtained according to the sensor value output from the sensor module.

15. The field device according to claim 13, further comprising:
  a communication unit configured to perform communication between the sensor module and the current controller; and
  a third power supply monitoring unit configured to stop an operation of the communication unit in a case in which an abnormality occurs in the third power supply voltage,
  wherein, in a case in which the communication unit stops operating, the current controller outputs the second signal.

16. The field device according to claim 15, further comprising:
  a transmitter which comprises the current controller, the current output unit, and the abnormality notification unit,
  wherein the transmitter is separated from the sensor module and connected to the sensor module via a cable, and
  wherein the sensor module outputs the sensor value to the communication unit via the cable.

17. The field device according to claim 13, further comprising:
  a power supply cutoff unit configured to cut off supply of at least the third power supply voltage with respect to the sensor module in a case in which an abnormality occurs in the first power supply voltage or the second power supply voltage.

18. The field device according to claim 17, wherein the power supply cutoff unit comprises:
  a switch configured to be turned on in a case in which the first power supply voltage and the second power supply voltage are normal, and configured to be turned off in a case in which at least one of the first power supply voltage or the second power supply voltage is abnormal.

19. The field device according to claim 18, wherein, in a case in which the switch is turned on, the third power supply voltage is supplied to the sensor module, and
  wherein, in a case in which the switch is turned off, supply of the third power supply voltage to the sensor module is cut off by the power supply cutoff unit.

20. The field device according to claim 1, further comprising:
  a first power supply circuit configured to generate the first power supply voltage by stepping down the second power supply voltage; and
  a second power supply circuit configured to generate the second power supply voltage from electric power which is supplied from an external device.

* * * * *